United States Patent [19]

Nishizawa

[11] Patent Number: 4,909,998
[45] Date of Patent: Mar. 20, 1990

[54] APPARATUS FOR PERFORMING SOLUTION GROWTH OF GROUP II-VI COMPOUND SEMICONDUCTOR CRYSTAL

[75] Inventor: Jun-ichi Nishizawa, Sendai, Japan

[73] Assignee: Zaidan Hojin Handotai Kenkyu Shinkokai, Sendai, Japan

[21] Appl. No.: 351,340

[22] Filed: May 9, 1989

Related U.S. Application Data

[63] Continuation of Ser. No. 170,639, Mar. 16, 1988, abandoned, which is a continuation of Ser. No. 829,861, Feb. 18, 1986, abandoned, which is a continuation of Ser. No. 489,950, Apr. 29, 1983, abandoned.

[30] Foreign Application Priority Data

Jun. 24, 1982 [JP] Japan .................... 57-109626

[51] Int. Cl.$^4$ ............................................. C30B 35/00
[52] U.S. Cl. ......................................................... 422/248
[58] Field of Search ............... 156/610, 611, 616.4, 156/616.41, DIG. 72, DIG. 73, DIG. 89; 164/122.1, 122.2, 348; 422/247, 248, 253

[56] References Cited

U.S. PATENT DOCUMENTS

| | | | |
|---|---|---|---|
| 3,305,486 | 2/1987 | Prener et al. | 156/616 R X |
| 3,410,665 | 11/1968 | Muller et al. | 156/616 X |
| 3,690,846 | 9/1972 | Akai et al. | 156/611 |
| 3,898,051 | 8/1975 | Schmid | 156/616 |
| 4,264,406 | 4/1981 | Haeskayle | 156/616 R |
| 4,315,796 | 2/1982 | Nishizawa | 156/622 X |

FOREIGN PATENT DOCUMENTS

57-77098 5/1982 Japan .
57-183400 11/1982 Japan .

OTHER PUBLICATIONS

Gilman, J. J., "The Art and Science of Growing Crystals", Wiley & Sons, 1963, pp. 152-162.
Bird et al.; Transport Phenomena; John Wiley & Sons, New York, 1960; pp. 283-288.

*Primary Examiner*—John Doll
*Assistant Examiner*—R. Bruce Breneman
*Attorney, Agent, or Firm*—Cushman, Darby & Cushman

[57] ABSTRACT

In performing a solution growth of a Group II-VI compound semiconductor crystal by relying on the temperature difference technique under controlled vapor pressure on a solution growth apparatus having a recrystallizing zone, a source crystal supply zone and a vapor pressure controlling zone enclosed in a growth quartz tube and placed under different temperatures for the respective zones, wherein a heat sink is provided at the bottom end portion of the recrystallizing zone to cause a thermal flow to pass therethrough to the outside of the whole apparatus to insure that a single crystal will grow from this bottom end portion of the zone. The quartz tube may be enclosed in a pressure-resistant tube to apply a pressure to the growth quartz tube externally thereof to avoid its destruction to enable the growth to be performed at a high temperature to obtain a high growth rate. Thus, a large size crystal having a good crystal perfection can be grown.

6 Claims, 4 Drawing Sheets

Temperature

APPARATUS FOR PERFORMING SOLUTION GROWTH OF GROUP II-VI COMPOUND SEMICONDUCTOR CRYSTAL

This is a continuation of Ser. No. 170,639, filed 3/16/88, which is a continuation of Ser. No. 829,861, filed 2/18/86, which is a continuation of Ser. No. 489,950, filed 4/29/83, all now abandoned.

BACKGROUND OF THE INVENTION (a) Field of the Invention

The present invention relates to an apparatus for performing a solution growth of Group II-VI compound semiconductor crystals.

(b) Description of the Prior Art

Such Group II-VI compound semiconductor crystals as ZnS amd CdS are the so-called direct gap semiconductors wherein the transition of carriers is of the direct transition type, and the energy band gap of these crystals is generally large.

Accordingly, Group II-VI compound semiconductor crystals are interesting materials for the manufacture of such semiconductor devices as LEDs having unique properties to exhibit spectra in the short wavelength region of blue and violet colors, which cannot be obtained from Group III-V compound semiconductor crystals.

These Group II-VI compound semiconductor source crystals, however, are difficult to accomplish a crystal growth therefrom, and to control their conductivity type when compared with the growth process of Group III-V compound semiconductor crystals. For these reasons, it is the present state of the art that the abovesaid interesting properties of these crystals are not sufficiently made use of effectively.

The energy band gap and the conductivity type of those Group II-VI compound semiconductor crystals which are obtained according to the conventional growth process are shown in Table 1.

TABLE 1

| Physical | Crystals | | | | | |
| Property | ZnS | ZnSe | ZnTe | CdS | CdSe | CdTe |
|---|---|---|---|---|---|---|
| Energy band gap (eV) | 3.6 | 2.67 | 2.2 | 2.5 | 1.74 | 1.5 |
| Conductivity type | n | n | p | n | n | n p |

It should be noted here that the conductivity types obtained as shown in the above table do not represent that they have been controlled as desired, but they are exactly reflecting the result of the crystal growths conducted. Accordingly, it is the present state of art that the carrier concentration of these crystals is not controlled either.

Group III-V compound semiconductor crystals of which one of the crystal-constituent elements has a higher vapor pressure over the other allow an epitaxial growth of a crystal from liquid phase at a relatively low temperature, leading to the development of various kinds of semiconductor devices. On the other hand, Group II-VI compound semiconductor crystals have not shown a significant development in the art with respect to their growth conducted by relying on the abovementioned method, for the following reasons. That is, in any group II-VI compound semiconductor crystal, the respective crystal-constituent elements have high vapor pressures, and also the melting points of these elements are high.

Therefore, in spite of the fact that, as compared with the growth of Group III-V compound semiconductor crystals, the control of the growth conditions for Group II-VI compound semiconductors requires to be more strict, the conventional growth of these latter crystals, in the past, has relied only on such "melt growth" process that is conducted under a high temperature and a high pressure as represented by Bridgman method.

Also, the other reasons why the solution growth technique for the growth of Group III-V compound semiconductor crystals (in practice, it is an epitaxial growth from liquid phase) has not been adopted for the growth of Group II-VI compound semiconductor crystals include, in addition to the fact that the above-mentioned respective crystal-constituent elements have high vapor pressures, the fact that the respective crystals have very low solubility in the "melt" or "solution" of either one of the elements which constitute the crystals.

Taking up, for example, ZnSe, it should be noted that, in the growth temperature zone which permits a solution growth of a ZnSe crystal, the solubility of ZnSe crystal to either the Zn melt or Se melt is extremely poor, leading to a difficulty in performing a solution growth. As a means to obviate this problem, there has been proposed a solution growth method which utilizes the fact that a ZnSe crystal has a solubility, to a certain degree, to Te which is also a Group VI element, and which, based on this fact uses a Te solution to serve as the solvent. In such case, however, the Group II-VI crystal thus obtained is just a mixed crystal, as a natural result, having the composition $ZnSe_{1-x}Te_x$, and it has not been possible to obtain a highly pure ZnSe crystal having good crystal perfection.

As a solution growth technique which eliminates many of the above-mentioned drawbacks of the prior art, the present inventor has proposed and disclosed earlier in Japanese Patent Preliminary Publication Nos. Sho 57-77098 and Sho 57-183400 a Group II-VI crystal growth method and an apparatus therefor, based on the invention by the present inventor of "temperature difference technique under controlled vapor pressure", which uses, as the solvent, a solution of one of the crystal-constituent elements having a higher vapor pressure over the other constituent element, and disposes a source crystal in the higher temperature zone of the solution, causing recrystallization to take place in the lower temperature zone of the solution, and further applies to the solution, from thereabove, a vapor pressure of the constituent element having a lower vapor pressure.

However, even when such new method as mentioned above is followed, although the techniques of controlling the crystallinity, the conductivity type and the carrier concentration have made a marked progress, still there have been present the drawbacks in said new method such that the reproduceability of the solution growth process is poor, and that a large-size crystal having good crystal perfection is not obtained.

SUMMARY OF THE INVENTION

It is, therefore, the object of the present invention to obviate the above-stated drawbacks of the prior art, and to provide an apparatus for performing a growth of a large single Group II-VI compound semiconductor crystal having good crystal perfection, with a satisfactory reproduceability.

BRIEF DESCRIPTION OF THE DRAWINGS

For the convenience of explanation, critical parts are assigned with like reference numerals and symbols throughout the drawings.

DETAILED DESCRIPTION OF THE PREFERRED EMBODIMENTS

The present invention will be described hereunder in further detail by giving reference to the accompanying drawings.

Table 2 shows the melting point, the density, the thermal conductivity which are the physical properties of respective elements employed in performing the growth of a Group II-VI compound semiconductor crystal.

TABLE 2

| Element | Physical Property | | |
|---|---|---|---|
| | Melting point (°C.) | Density (g/cm³) | Thermal conductivity (Watt/cm · K) |
| Zn | 419.6 | 7.14 | 1.19 at 0° C. |
| | | | 0.59 at 450° C. |
| Cd | 320.9 | 8.65 | 0.98 at 0° C. |
| S | 112.8 | 2.07 | |
| | 119.0 | 1.96 | 0.004 at 0° C. |
| Se | 217 | 4.80 | 0.0024 at 0° C. |
| Te | 449.5 | 6.24 | 0.015 at 0° C. |

Figure 1:
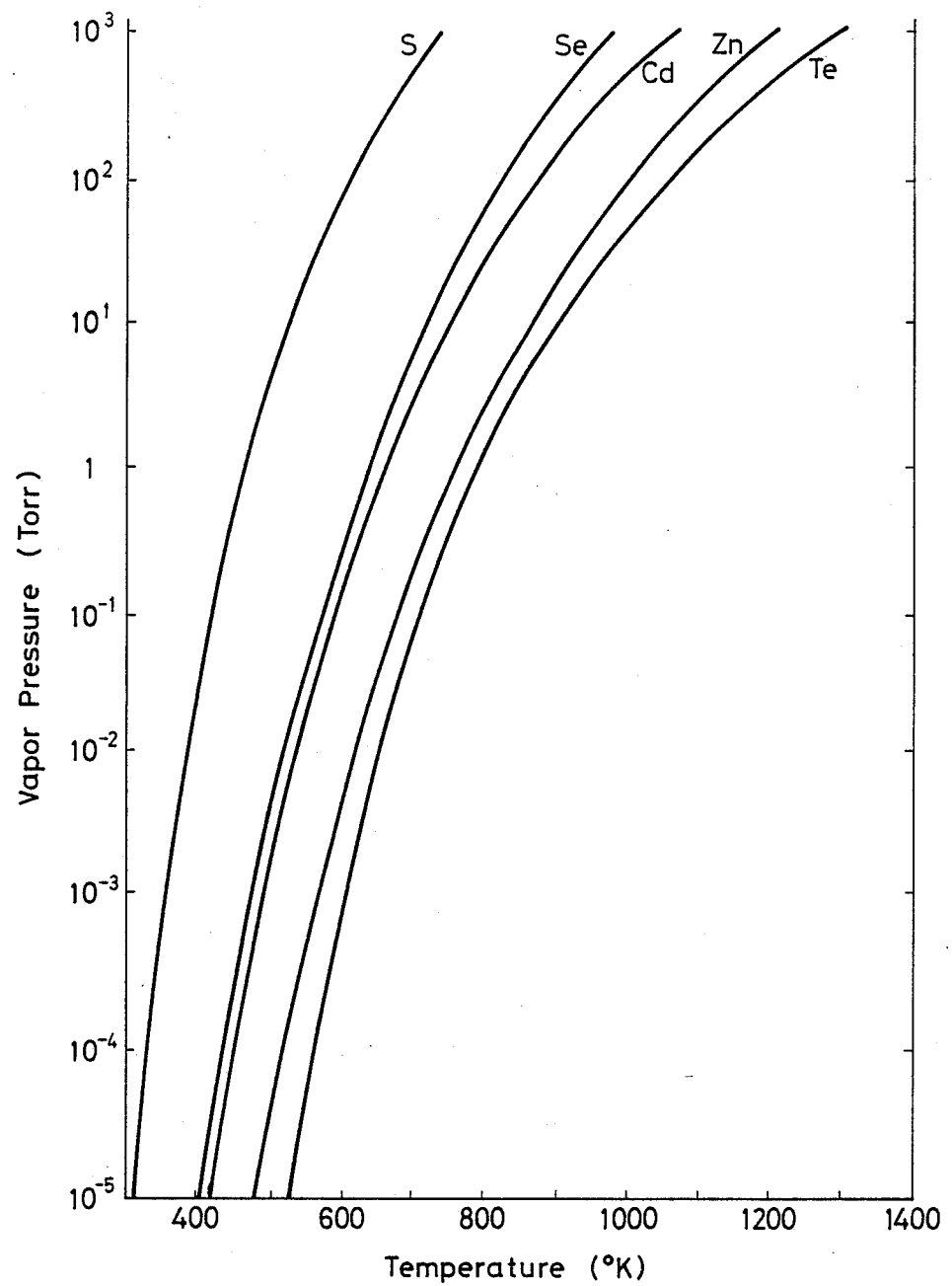
FIG. 1 is a chart showing the relationship between the temperature and the vapor pressure of Group II elements and Group VI elements.

In connection to this table, the relationship between the temperature and the vapor pressure of these elements is shown in FIG. 1.

The crystal growth apparatus according to the present invention will be described hereunder in detail on a ZnSe crystal as a typical example among the Group II-VI compound semiconductor crystals to which the present invention can be applied.

The physical properties of Zn and Se which constitute a ZnSe crystal can be compared with each other easily by giving reference to Table 2 and FIG. 1. It will be noted that these elements invariably have large vapor pressures. However, at a same temperature, Se has a much higher vapor pressure than Zn, but Se has a melting point which is lower by about 200° C. than Zn.

On the other hand, no detailed reports have been made yet as to the solubility of a ZnSe crystal to either a Zn melt or an Se melt. However, in the growth temperature zone in which either a melt growth or a solution growth is performed, the solubility can be estimated to be about 1% or less. Therefore, in order to augment the growth rate as much as possible, it is necessary to set the temperature of the melt high enough to increase the solubility of the crystal in the melt or solution.

However, as will be apparent from FIG. 1, Zn and Se both have high vapor pressures. Accordingly, when considering the value of the vapor pressure of Se which is higher than Zn, and under the assumption that a quartz tube which is often employed in performing a crystal growth is used for the growth of a crystal by relying on the usual growth technique, the upper limit of the temperature for the crystal growth will be about 1000° C. from the viewpoint of the mechanical strength of the quartz tube itself.

Now, hereunder will be described the method and its drawbacks of the conventional temperature difference technique under controlled vapor pressure which has been proposed by the present inventor, by giving reference to FIG. 2 which shows an example of the growth apparatus structure.

Figure 2:
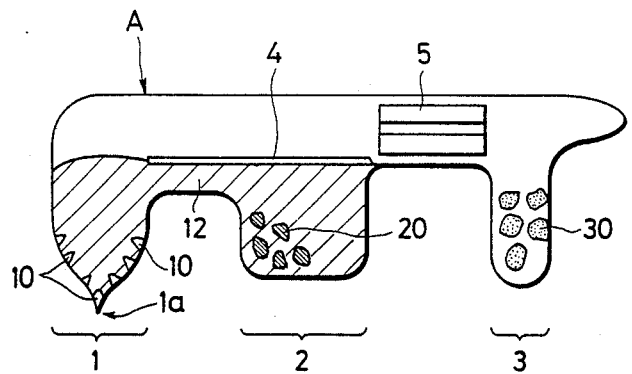
FIG. 2 is a schematic illustration of a horizontal type growth ampule structure employed in the crystal growth process using the conventional temperature difference technique under controlled vapor pressure.

FIG. 2 is a schematic sectional illustration of a quartz ampule generally indicated at A in case the above-mentioned conventional method is applied thereto.

The quartz ampule A of FIG. 2 which is employed in the crystal growth may be divided roughly into the following three zones 1, 2 and 3 of different temperatures, respectively.

A low temperature zone 1 where a Group II-VI crystal 10 recrystallizes is communicated, by a melt 12, with a high temperature zone 2 where a source crystal 20 is charged. A screening wall 4 is disposed above the melt 12 so as to supply the vapor of a crystal-constituting element having a lower vapor pressure substantially only to the low temperature zone 1. A crystal-constituting element 30 having said lower vapor pressure is placed in the temperature zone 3 which is independent of both the zones 1 and 2. The vapor of this element 30 is supplied therefrom to the zones 1 and 2. In order to suppress the entry of the element vaporizing from the melt 12 into the zone 3, and to insure that the flow of the vapor of the constituent element 30 takes place only in a single direction, the effective cross sectional area of the portion of the ampule located between the zones 2 and 3 is reduced by narrowing said portion, or alternatively there may be inserted in said portion a quartz tube 5 of a different diameter in such manner as shown in FIG. 2. By the atomic diffusion due to the temperature difference between the zone 1 and the zone 2, the source crystal 20 contained in the high temperature zone 2 is transported into the zone 1 where it recrystallizes, and thus a Group II-VI compound semiconductor crystal is obtained. However, in case a Group II-VI crystal is grown in a manner as described just above, it should be noted that, not only in a tip portion 1a of the low temperature zone 1 of the ampule where a crystal nucleus is to form easily, but also at various sites on the inner surface of the wall of the quartz ampule other than said tip portion 1a, there are formed many nuclei in a non-reproduceable state, so that Group II-VI crystals will be grown at various sites within the ampule. Although these small crystals thus grown have good crystal perfection individually, there is the difficulty that no large single crystal is grown.

If, in such instance, the crystal growth process is continued for a considerably long period of time, there may be formed a large crystal centering around the tip portion 1a. However, in such case, those small single crystals which are grown at many sites on the inner wall surface of the quartz ampule will become combined together, and there is obtained only a polycrystal.

The reasons therefor have been investigated. It has been found that the most important reason why there does not appear the phenomenon that a crystal growth starts only at the tip portion 1a and the growth advances therefrom continuously lies in that this known growth apparatus is not arranged so as to allow the thermal flow caused by the temperature difference to pass only through the tip portion 1a.

Accordingly, the present invention provides a growth apparatus arranged so that the thermal flow due to the establishment of a temperature difference between the zones 1 and 2 will escape only from the tip portion 1a of the growth zone 1 of the ampule. Some embodiments of the core of the growth apparatus of the present invention will be shown in FIGS. 3, 4 and 5.

Figure 3:
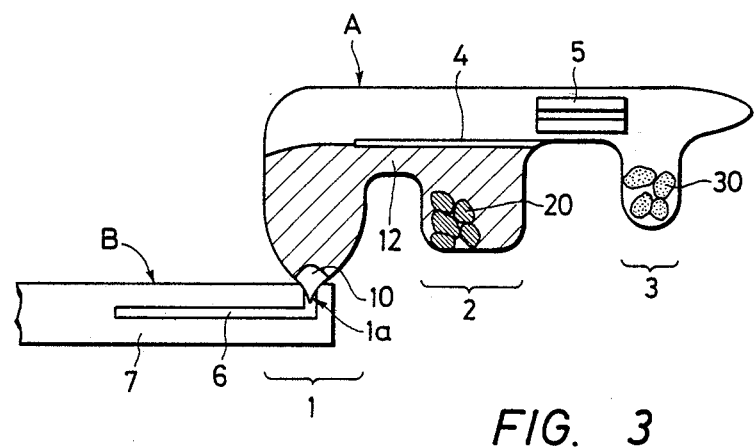
FIG. 3 is a schematic illustration of an embodiment of the horizontal type growth ampule structure provided with a heat sink and intended for the growth of a Group II-VI crystal using the temperature difference technique under controlled vapor pressure.
Figure 4:
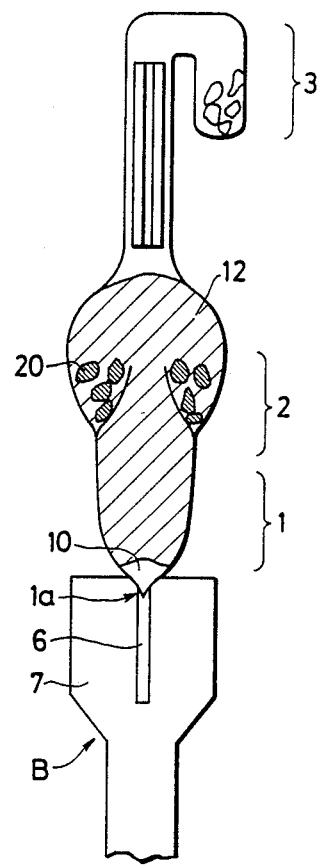
FIG. 4 is a schematic illustration of another embodiment of the vertical type growth ampule structure provided with a heat sink and intended for the growth of a Group II-VI crystal using the temperature difference technique under controlled vapor pressure.
Figure 5:
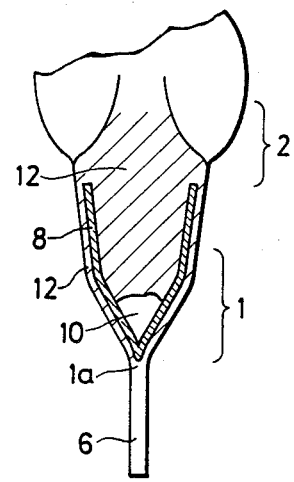
FIG. 5 is a schematic illustration of still another embodiment that a crucible having a large thermal conductivity is disposed as a heat sink in the low-temperatured recrystallization zone located within the vertical type growth ampule structure for the growth of a Group II-VI crystal using the temperature difference technique under controlled vapor pressure, omitting the illustration of other parts for the simplicity of explanation.

The embodiments of the growth apparatus shown in FIGS. 3, 4 and 5 are such that the structures and arrangements of those zones other than the recrystallization zone 1 are substantially the same, but, starting at the tip portion 1a of the low-temperatured growth zone 1 and extending toward the remaining portions of this zone, there is connected to said tip portion 1a a narrow quartz rod 6 which is surrounded by a material 7 such as carbon having a large thermal conductivity to provide jointly a heat sink means B. The size and configuration of this rod 6 and/or the material 7 are determined depending on the design for each instance. For example, the rod 6 may not be of such a length as shown, as the case may be. The point lies in arranging the heat sink assembly so that the tip portion 1a of the ampule A is contacted or nearly contacted by a material 7 having the function of a heat sink to insure that the thermal flow-out will take place at this tip portion 1a.

By so arranging as described above, the source crystal 20 contained in the high temperature zone 2 is transported due to the established temperature difference to the crystal-depositing or recrystallizing zone 1. Thanks to the presence of the heat sink means B, the tip portion 1a is now provided with the structure ensuring that the heat is caused to escape most effectively therefrom, so that the nucleus is grown only at the tip portion 1a of all the inner wall surface portions of the low-temperatured zone 1. Thereafter, the solute atoms will concentrate, due to diffusion, in this particular portion where the nucleus is present. Accordingly, these solute atoms will progressively enlarge the nucleus which is located at said tip portion 1a, and thus the growth of a crystal progresses. Thus, even in this low temperature zone of low solubility, there can be obtained a large-size single crystal. During this part of the growth process, as proposed earlier by the present inventor as the vapor pressure control technique, the crystal-constituent element (in this embodiment, it is Zn) 30 having a lower vapor pressure and being contained in the zone 3 is subjected to a temperature control, so that the vapor of this element 30 is supplied toward the solution 12 contained in the zone 1 and zone 2 from thereabove. Accordingly, this constituent element having a lower vapor pressure which has entered into the low temperature zone is held under a pressure onto the surface of the solution and kept therein so as not to allow the escape of the solute from the solution. Thus, owing to the provision of the vapor pressure of this constituent element, the crystal which is formed through recrystallization in the tip portion 1a of the zone 1 will be kept successfully not to deviate from the stoichiometric composition.

Now, an example of crystal growth performed by using the growth apparatus of the present invention will be described. 20 g of Se and 10 g of source ZnSe are charged in the ampule at their respective sites, and a growth is conducted at 1050° C. for 160 hours. As a result, a single crystal having a diameter of 10 mm and a length of 15 mm is obtained. It should be noted here that there has never before been obtained a single crystal of such large size as mentioned above through such a low growth temperature and for such a reasonable duration of growth process. Besides, the growth adopts the temperature difference technique under controlled vapor pressure. Accordingly, the crystal thus obtained exhibits a good crystallinity, and furthermore, owing to the fact that the crystal growth always starts at the tip portion 1a of the ampule, the crystal can be obtained with a good reproduceability.

The calory which flows through the heat sink B depends on its configuration, thermal conductivity and temperature gradient. Calory Q due to thermal conduction is determined by the following formula:

$$Q = -X \cdot \text{grad } T \text{ (W)}.$$

Q is determined by the ratio "X:thermal conductivity (W/cm·K)". Therefore, the type of material of the heat sink should be determined by taking into consideration the relationship with the factors, i.e. the temperature difference and the growth temperature.

Examples of the material for use in preparing the heat sink and the values of their thermal conductivities are shown in Table 3.

TABLE 3

| Material | Thermal Conductivity (W/cm · K) |
| --- | --- |
| Carbon | 0.8–2 at 0° C. |
| $Al_2O_3$ | 0.16 at 20° C. |
| Stainless steel | 0.14 at 0° C. |
| Quartz | 0.014 at 0° C. |
| Fire brick | 0.0015 at 0° C. |
| Pyrolitic boron nitride (PBN) | 0.63 a-axis at 800° C. |
| | 0.0294 c-axis at 800° C. |

For example, in case carbon is used as the material of the heat sink in FIG. 4 which illustrates a vertical type growth apparatus, if the low-temperatured zone where a crystal growth takes place has a cross sectional area of 1 $cm^2$ and the temperature gradient toward the tip portion in the low-temperatured zone is 5° C./cm, the thermal conductivity Q will be:

$$Q = 1(\text{W/cm·K}) \times 5(\text{K/cm}) \times 1 \text{ cm}^2 = 5\text{W}.$$

In other words, this much of calory has to travel always toward the heat sink during the growth process.

In general, there is required a heat sink having such a capacity as will be sufficient to let the thermal flow coming from the source crystal section due to the growth temperature and also to the temperature difference escape to the outside of the growth apparatus after passing through the tip portion of the recrystallizing zone.

Also, in case the solution serving as the solvent is prepared with, for example, Se atoms which have a smaller thermal conductivity than quartz, it should be noted that, in spite of the provision of the heat sink, the thermal flow does not make its passage through the solution, but instead the heat will flow mostly through the wall of the quartz ampule, causing the formation of nuclei at various sites along the inner surface of the wall of the ampule, and thus there may occur instances where the effect of the present invention cannot be expected. To avoid such mishap from arising, it is only necessary to adopt such structure as mentioned in FIG. 5.

FIG. 5 shows, on an enlarged scale, mainly the low-temperatured zone where recrystallization takes place. In this arrangement, there is disposed, on the inside of a quartz ampule, a crucible 8 which is made of a material such as carbon or PBN having a large thermal conductivity to serve as a modified type of heat sink. The space present between this crucible 8 and the inner surface of the wall of the quartz ampule is filled with an Se solution 12. Only the narrowed end portion of the crucible 8 is in contact with the tip portion 1a of the ampule. With this arrangement, the thermal flow within the crucible 8 will perfectly be directed toward the tip portion 1a, so that within the crucible 8, the crystal growth will start at the forward narrow end portion of the crucible, and thus, the abovesaid mishap can be avoided.

In case a crystal-constituting element having a value of a higher vapor pressure is used as a solvent, there could occur, depending on the growth condition, an increase in the pressure within the quartz ampule, so that the mechanical strength of the quartz tube could be insufficient or not resistant thereto.

For example, in case a ZnSe crystal is grown by using Se as the solvent, if the growth temperature is set at about 1050° C., the vapor pressure within the quartz ampule will reach about 39 atmospheric pressure. If the largest portion of the quartz ampule is assumed to be about 20 mm in inner diameter, the mechanical strength of this ampule will be about 30 atmospheric pressure. With such condition, this ampule will be destined to destruction, and no growth can be done.

Figures 6A, 6B:
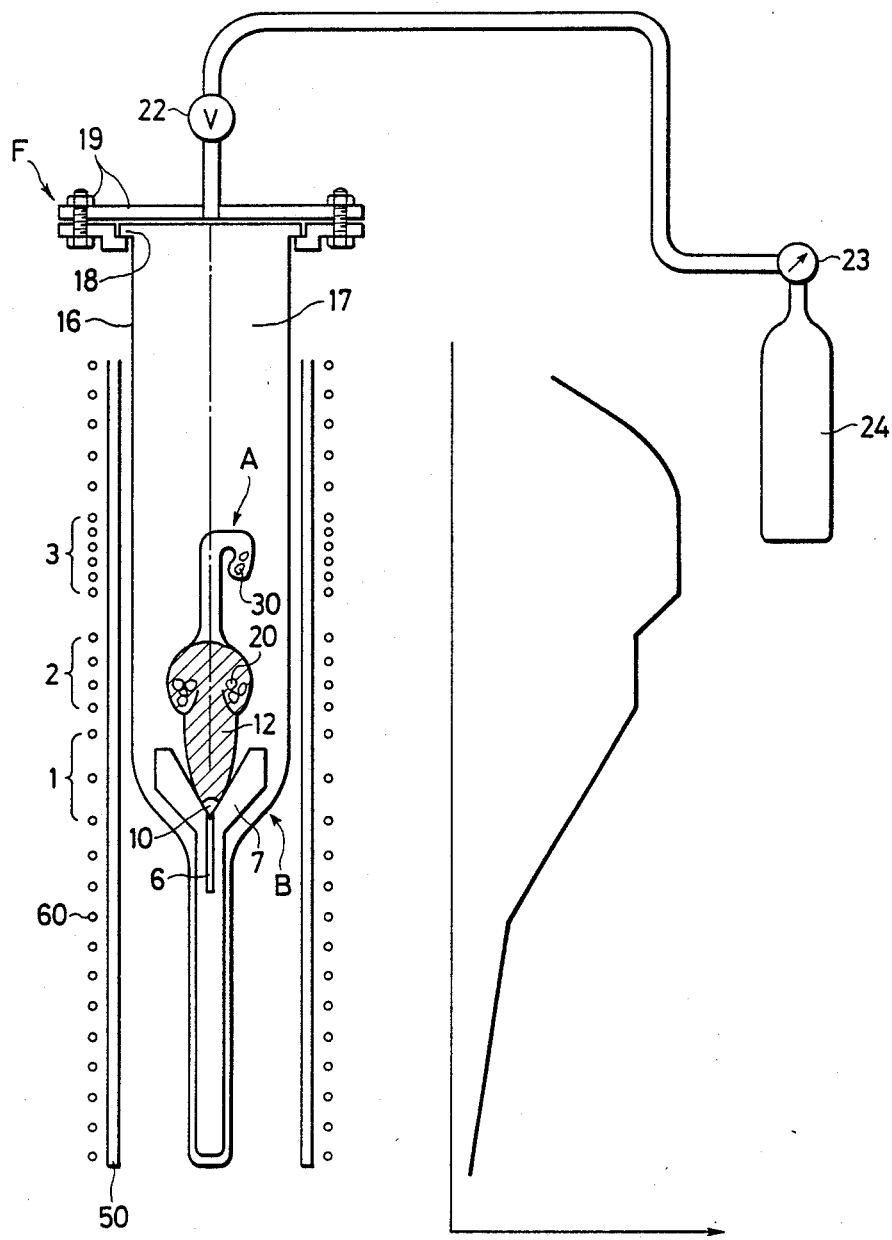
FIGS. 6A and 6B, in combination, are schematic illustrations of yet another embodiment of the vertical type growth ampule structure provided with a heat sink and intended for the growth of a Group II-VI crystal and provided with a system for applying a pressure to the ampule externally thereof, and show the temperature levels in respective sections of the ampule.

In such instance, the present invention may be applied in such manner as will be described hereunder. As a principle, a quartz ampule having the structure embodying the present invention is placed within a pressure-resistant container, and the quartz ampule is provided, exteriorly thereof, with a pressure given by, for example, an inert gas. One such example, along with the temperature distribution, will be shown in FIGS. 6A and 6B. A quartz ampule having a recrystallizing section 1, a source crystal section 2, a vapor pressure controlling section 3 and a heat sink section B is placed within a pressure-resistant tube 16 made of either quartz, $Al_2O_3$ or other ceramics material. The pressure-resistant tube 16 is housed in a tubular furnace 50 made with, for example, quartz and this container, in turn, is wound therearound with a electro-conductive wire to heat this container. The coil 60 of the heating furnace 50 is wound in such manner that the portion of the coil 60 located at the zone 3 is most closely wound, and less closely at the zone 2 and least closely at the zone 1 as desired, to thereby establish a desired temperature difference between the zones 1 and 2, and to cause a vapor of the element charged in the zone 3. Such arrangement of the heating furnace 50 is applicable to all these embodiments mentioned, though the heating furnace is not mentioned in FIGS. 2 to 5 for the simplicity of explanation. As the means for enclosing a highly pressurized gas 17 in this pressure-resistant tube, there may be adopted a pressure-resistant tube system 16 as shown in FIG. 6A having a closed one end, the other open end being provided with a collar 18, and this open end is equipped with a fastening means F comprising a bolt-nut and flange assembly 19 to hermetically fasten the open end of the tube 16. The flange-equipped end of this tube 16, in case it is formed with quartz, will be resistant to about 20 atmospheric pressure. As the means to apply a pressure to the quartz ampule exteriorly thereof, the pressure-resistant tube 16 is arranged to communicate, at its open end, through the flange assembly 19, and via a stop valve means 22 and a pressure regulating means 23, to a container 24 containing $N_2$ or Ar gas, to introduce such gas gradually into the pressure-resistant tube 16. In case this tube 16 is made with quartz, its usable limit against applied temperature is up to about 1150° C. Beyond this limit, there could arise the fear that the quartz pressure-resistant tube 16 will swell due to the inner pressure of 10 atmospheric pressure. Accordingly, in order to conduct a crystal growth at a still higher temperature, it is desirable to use a pressure-resistant tube made of $Al_2O_3$ or a ceramic material, instead of quartz. By the application of a pressure, by using a gas, to the external side of the quartz ampule to carry out a crystal growth as described above, it should be noted that, as compared with the instance wherein no pressure is applied externally thereto, safety can be insured even when the vapor pressure within the quartz ampule rises to a higher level. Thus, it becomes possible to set the growth temperature at a high level, and as a result it is possible to increase the growth rate.

It is needless to say that this pressure-resistant tube assmebly may be provided to the preceding embodiments.

Description of some embodiments of the crystal growth apparatus according to the present invention has been made above with respect to the growth of ZnSe crystals. It will be needless to say that the present invention is not limited to this compound semiconductor, but equally effectively also to other Group II-VI compound semiconductors and further to the growth of a mixed crystal of Group II-VI compound semiconductor such as $ZnSe_{1-x}Te_x$.

What is claimed is:

1. An apparatus for performing a solution growth of a single Group II-VI compound semiconductor crystal, having a pressure-resistant tube means for enclosing a crystal growing quartz ampule, said ampule being provided with a substantially V-shaped recrystallizing zone, said pressure-resistant tube being surrounded by a heating furnace, said apparatus further having a Group II-VI source crystal zone, and a vapor pressure control zone, all of which are enclosed in said quartz ampule, said heating furnace having a heating unit to provide different temperatures to three zones of said ampule independently of each other, wherein said apparatus includes:

(a) means for establishing a temperature difference between the recrystallizing zone and the source crystal supply zone in such manner that the temperature of the recrystallizing zone is lower than that of the source crystal supply zone;

(b) means for communicating the recrystallizing zone with the source crystal supply zone, said communicating means being capable of containing a solution of a first crystal-constituting element having a vapor pressure higher than the vapor pressure of any of the remaining crystal-constituting elements;

(c) means for containing in the vapor pressure control zone a second crystal-constituting element having a vapor pressure lower than the vapor pressure of the remaining crystal-constituting elements;

(d) means for heating said vapor pressure control zone in order to supply a desired vapor pressure of said second crystal-constituting element onto the surface of said solvent;

(e) heat sink means provided at a tip portion of the substantially V-shaped recrystallizing zone for conducting heat from said tip portion to thereby begin a growth of a large single Group II-VI compound semiconductor crystal only at said tip portion of the substantially V-shaped recrystallizing zone, said heat sink means comprising a seamless quartz rod surrounded by a thermally conducting material selected from the group consisting of carbon, $Al_2O_3$, stainless steel and pyrolitic boron nitride; and (f) gas pressurizing means for filling space between said pressure-resistant tube means and ampule with an inert gas and for maintaining the pressure of said gas in said space so that said pressure is substantially above atmospheric pressure.

2. An apparatus according to claim 1 wherein said gas pressurizing means includes an external pressure control means in communication with said pressure-resistant tube means.

3. Apparatus according to claim 1, wherein said pressure-resistant tube means is made of quartz, $Al_2O_3$ or ceramic.

4. Apparatus according to claim 1, wherein said pressure-resistant tube means is made of $Al_2O_3$ or ceramic to withstand said pressurized gas.

5. Apparatus according to claim 1 wherein said pressure-resistant tube means also encloses said heat sink means.

6. Apparatus according to claim 5 wherein said heat sink means has an end remote from said ampule which end is substantially at a corresponding end of said furnace.

* * * * *